United States Patent [19]

Kahn

[11] 4,424,593
[45] Jan. 3, 1984

[54] SUPPRESSED CARRIER COMMUNICATIONS SYSTEM

[76] Inventor: Leonard R. Kahn, 70 N. Grove St., Freeport, N.Y. 11520

[21] Appl. No.: 427,497

[22] Filed: Sep. 29, 1982

Related U.S. Application Data

[63] Continuation of Ser. No. 835,115, Sep. 20, 1977, abandoned, which is a continuation-in-part of Ser. No. 706,440, Jul. 19, 1976, abandoned, Ser. No. 563,658, Mar. 31, 1975, abandoned, and Ser. No. 356,493, May 2, 1973, abandoned.

[51] Int. Cl.³ .............................................. H04B 1/68
[52] U.S. Cl. ...................................... 455/47; 455/63; 455/71; 455/263
[58] Field of Search ........................ 455/46, 47, 63, 71, 455/109, 203, 263, 264

[56] References Cited

U.S. PATENT DOCUMENTS

| | | | |
|---|---|---|---|
| 3,147,437 | 9/1964 | Crafts et al. | 455/47 |
| 3,271,602 | 9/1966 | Bucher, Jr. | 455/47 |
| 3,271,681 | 9/1966 | McNair | 455/47 |
| 3,286,183 | 11/1966 | Bergemann | 455/202 |
| 3,634,766 | 1/1972 | Boyer | 455/47 |

*Primary Examiner*—Michael A. Masinick

[57] ABSTRACT

A radio transmission system of the suppressed carrier type incorporating means for correcting frequency errors. The transmission circuit can include the usual components which first produce a carrier wave, an upper sideband, and a lower sideband. The carrier wave and one of the sidebands are eliminated and only the desired sideband is radiated. The transmitter also incorporates a highly selective circuit which substantially reduces the amplitude of all audio frequencies below about 350 hertz. This frequency characteristic is used as a frequency reference to regenerate the carrier wave in the receiving system. Since low frequencies of 350 hertz are not present in voice waves at all instances, a storage circuit is employed to store a control voltage during the absence of low frequency sounds which would have the identifying frequency step.

16 Claims, 7 Drawing Figures

FIG. 1
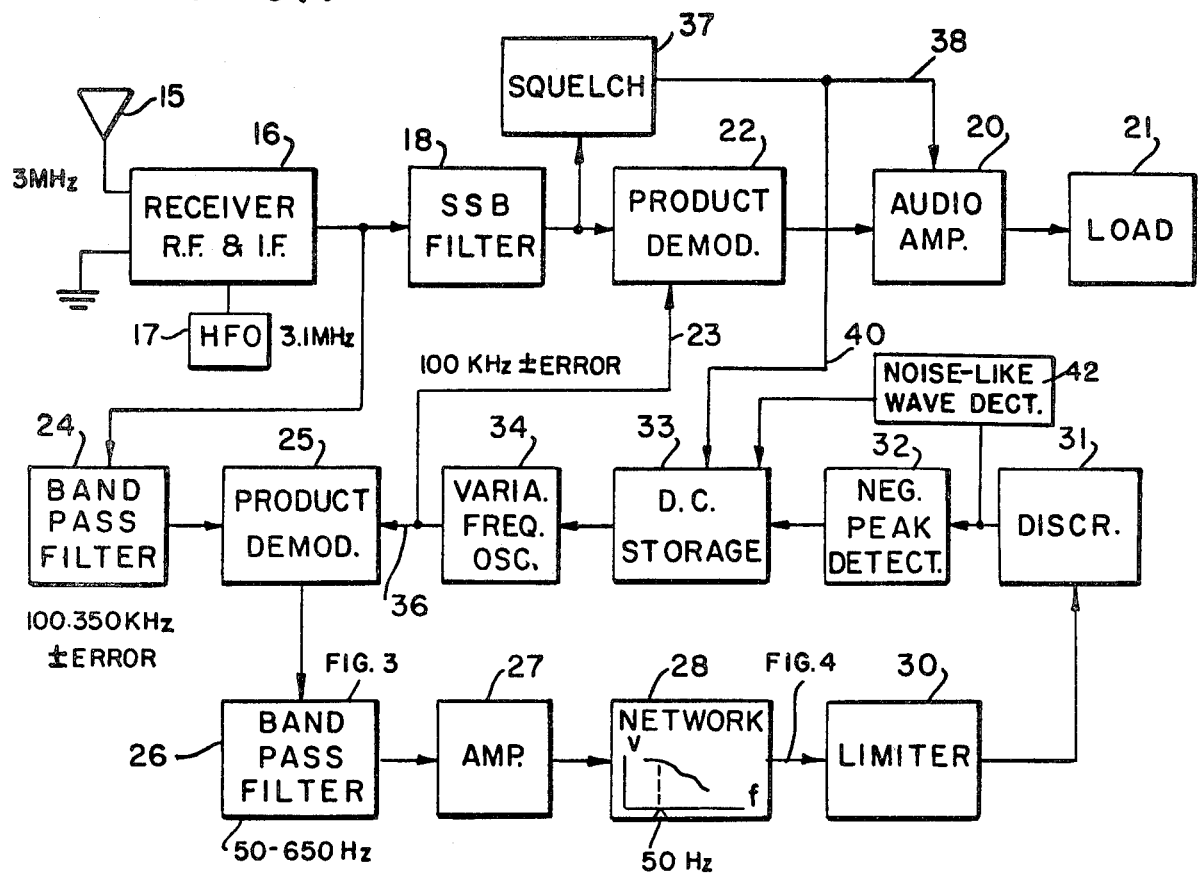
FIG. 2
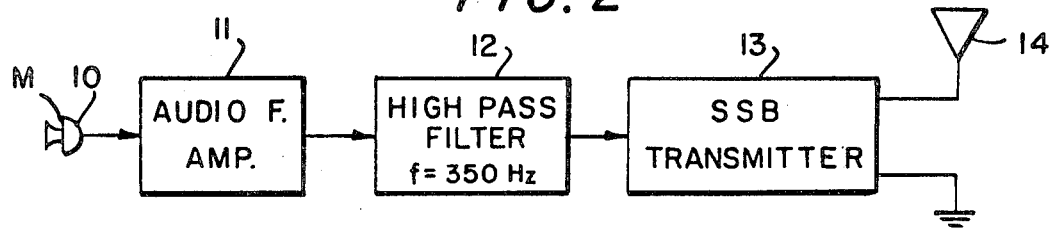
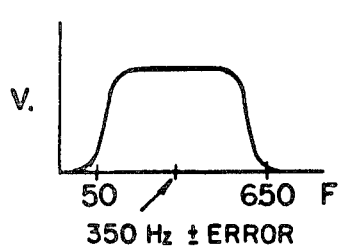
FIG. 3
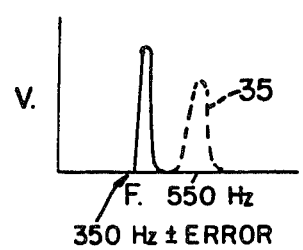
FIG. 4
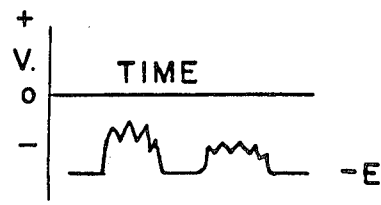
FIG. 5

SUPPRESSED CARRIER COMMUNICATIONS SYSTEM

This application is a continuation of application Ser. No. 835,115 filed Sept. 20, 1977 now abandoned. Ser. No. 835,115 was a continuation-in-part of applications Ser. No. 706,440 filed July 19, 1976 now abandoned, Ser. No. 563,658 filed Mar. 31, 1975 now abandoned, and Ser. No. 356,493 filed May 2, 1973 now abandoned.

BACKGROUND OF THE INVENTION

Single-sideband radio transmission systems (A3H) using a full carrier have been in use for some time. Also, single-sideband systems using a reduced carrier (A3A) have been used in many situations. While single-sideband suppressed carrier systems (A3J) have been used extensively, they either require the use in both receiver and transmitter of highly stable special crystal oscillators or require constant attention by operating personnel in order to maintain frequency synchronism. Such systems may also use a subcarrier but this arrangement has many of the undesirable characteristics of A3A transmission. Errors in the order of twenty cycles per second between the original carrier and the injected carrier can greatly degrade the quality of the modulating waves, if the modulated waves are voice frequencies. Larger amounts of frequency difference can cause the loss of intelligibility, especially under poor signal-to-noise conditions. Thus it has been common practice to use the high stability and more expensive oscillators in SSB systems. In addition, the ionosphere can create some doppler errors, adding or subtracting up to 10 hertz to the transmitted single-sideband, under disturbed conditions, thereby increasing the loss of intelligibility.

The use of SSB suppressed carrier systems between high speed aircraft and between aircraft and ground stations can produce doppler errors which, even for moderately high frequency operation, can create excessive frequently translation errors.

Several attempts have been made to eliminate these errors. In the IEEE Transactions on Communication Technology for October 1971, a phase locked loop system is described by O. G. Villard (also in U.S. Pat. No. 3,704,420). In this system, the main frequency components from the product detector are adjusted so that they are equal to the frequency components derived from a diode envelope detector. This type of adjustment may be difficult to maintain especially in the presence of noise and interference. U.S. Pat. No. 3,675,131 also discloses an arrangement for SSB transmission of data impulses, using a function generator to produce an error signal which, when applied to a local oscillator, compensates for doppler and reflection errors. This system was developed for data transmission.

The present invention uses a new approach to the problem and uses a simple filter at the transmitter to cut off the speech frequencies at a predetermined value in the range of 100 to 500, for example a 350 Hz high pass filter. All voices, including those of women and children, contain low frequency components and when a sharp cut-off is present in the modulated frequency, this value can be used at the receiving circuit to re-establish the carrier. Such a condition can be realized by either using an audio high pass filter prior to modulation or the sideband filter used in the SSB generator can be adjusted to cut off all frequencies closer to the carrier wave than 350 hertz. Once this is done the transmitted wave will have the necessary identifying characteristics to produce the proper carrier frequency at the receiver regardless of the varying doppler error.

It is also possible to use a low pass filter to cut off all the speech frequencies at a high value, such as 2,800 Hz. (the cut off frequency) and using this value at the receiving end to adjust the inserted carrier frequency. However, the low frequency cut-off value is preferred.

The receiving portion of the system includes a conventional front end, first oscillator, and intermediate frequency amplifier. The output of the IF amplifier is applied to a SSB filter and then to a product demodulator which also receives a variable frequency from a controlled oscillator. The controlled oscillator normally delivers the correct carrier frequency but when an error is introduced for any reason, the oscillator frequency is varied to counteract the error and the beat frequencies delivered to the audio amplifier and the output circuit load are the same as applied to the transmitter circuit.

The circuit described here and after is a superheterodyne type receiver utilizing, for example, an intermediate frequency of 100 kHz. As is generally true for SSB receivers the second detector uses a product demodulator type circuit wherein the 100 kHz intermediate frequency wave is converted to audio frequencies. It is possible to correct for frequency errors by adjusting either the oscillator feeding the first mixer in the receiver or the oscillator feeding the product demodulator so as to remove frequency translation errors introduced either in the transmitter the ionosphere or the receiver. In any case, a predetermined cutoff frequency value either above or below the range of transmitted audio frequencies is employed to adjust one of the oscillators at the receiver to an optimum value.

The primary circuit as shown includes the usual superheterodyne combination, a sideband filter, product demodulator, and audio amplifier. The control circuit includes a band pass filter, a second product demodulator, and a loop control which samples the lowest audio frequency, transforms this frequency value into a direct current and then applies this DC voltage to one of the variable frequency oscillators, so as to correct for frequency errors.

The main feature of the invention is the use of a low or high frequency cut off in the transmitted audio range to define and locate the frequency translation error.

Another feature of the invention is the loop circuit which samples the lowest audio frequency in the received wave, determines its variance from the original cut off frequency, and then adds a correction factor to a variable frequency oscillator to cancel the error.

Another feature of the invention is the use of a band pass filter which is centered at 350 hertz, the cut off audio frequency. This filter is wide enough to pass any other frequency generated by normal errors. The band pass filter is narrow enough to eliminate waves from interference sources that otherwise might falsely control the loop system. This filtering effect can also be achieved in whole or in part at the intermediate frequency or in other circuits in the low frequency path.

Other features and additional details of the invention will be disclosed in the following description, taken in connection with the accompanying drawings.

BRIEF DESCRIPTION OF THE FIGURES

FIG. 1 is a schematic showing of the receiving circuit with the component circuits shown in block.

FIG. 2 is a schematic showing of the transmitting circuit.

FIGS. 3, 4, and 5 are graphs showing the transmission characteristics of portions of the receiver circuit.

DESCRIPTION OF THE PREFERRED EMBODIMENT

Figure 6:
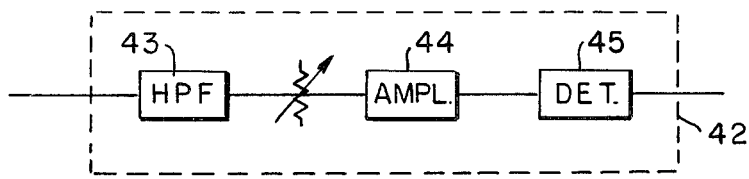
FIG. 6 is a schematic showing of the noise-like wave detector shown in FIG. 1.

Referring first to FIG. 2, the transmitting circuit includes the usual microphone 10, an audio frequency amplifier 11, and a high pass filter 12, which is designed to cut off sharply at a predetermined frequency, such as 350 Hz. The output of filter 12 is applied to a single sideband (SSB) transmitter 13 which transmits to antenna 14 a single sideband without any carrier. Some presently known transmitters incorporate suitable filtering in that their sideband filters provide very sharp attenuation of the lower audio frequencies in which event the additional high pass filter 12 may not be required.

FIG. 1 is the preferred receiver circuit and includes an antenna 15, a superheterodyne circuit 16 with its high frequency oscillator 17. If the receiver 16 has tunable radio frequency stages, the oscillator 17 is provided with a frequency control which is varied with the stages, this combination producing a frequency equal to the difference between the received frequency and the oscillator frequency. If a 3.0 megahertz signal is received and the oscillator produces 3.1 megahertz, the output signal sent to the filter circuit 18 has a frequency of 100 KHz.

Assuming that the lower sideband is transmitted, the filter circuit 18 passes all frequencies between about 100 KHz and 103 KHz thereby including the frequencies necessary for the audio amplifier 20 and the load 21. The audio frequencies are produced by a product demodulator 22 which first produces a beat frequency between the signal from filter 18 and a carrier wave sent over conductor 23 from a control circuit to be described later. Since the carrier wave is not received by the antenna, it must be generated by the control circuit, the only information available being the lowest sideband frequency which at this point should be 100.350 kilohertz.

The control circuit which generates the correct beat frequency to be applied to the product demodulator 22 includes a band pass filter 24, having a center frequency of 100.35 KHz, a second product demodulator 25, and a second band pass filter 26 arranged for passing all frequencies between 50 and 650 Hz. (See FIG. 3). The output of this filter is amplified by amplifier 27 and applied to a network 28 having a rapidly increasing attenuation characteristic as the frequency increases above 50 Hz and should have a very strongly attenuated output above 650. Hz. This network, in cooperation with the high pass filter 12 used in the transmitter, will cause a sharp peak in frequency spectrum so that the waves representing the transmitted 350 cycles will be readily identified as a narrow band of frequency values, (See FIG. 4). The network output is applied to a limiter circuit 30 which produces a constant amplitude signal. This wave is then sent to discriminator circuit 31 which produces for, example negative voltages for low frequency waves and decreasing negative voltages for the higher frequency waves. In this manner, when low frequencies are present, a high negative voltage is produced and applied to a peak detector circuit 32 which detects the most negative going portion of the wave. This negative voltage is responsive to the frequency of the signal to be corrected. The negative peak detector then feeds its signal to a storage circuit 33 which stores this negative voltage and in turn applies the voltage to a variable frequency oscillator 34 to control its frequency output. The normal frequency output of 100 KHz is sent over conductor 23 to the product demodulator 22 to beat with the output of the sideband filter 18 and produce the correct output frequencies.

In order to illustrate the operation of this circuit, let it be assumed that, because of an error in the high frequency oscillator 17, a frequency of 3.1002 MHz is produced instead of the correct value of 3.1 MHz. Under these conditions the output of the receiver 16 and circuit SSB 18 is 100.2 KHz. The lowest frequency component sent to the band pass filter will now be 100.550 KHz instead of 100.350 KHz. This higher frequency while not at the center of the band pass characteristic will still be passed with only a small amount of attenuation to both product demodulators 22 and 25.

The output of the first demodulator 22 would, at the first instant be 200 cycles per second higher than it should be and during those instances the low frequency band edge is 550 Hz. At this instant the output error of the system is 200 Hz too high. This wave (of 550 Hz) then passes through filter 26, amplifier 27, and network 28, presenting a fairly sharp spectrum component of 550 Hz as shown by the dotted line 35 in FIG. 4. This wave then passes through circuit 30 where all the waves are limited, then through the discriminator circuit where the signal is transformed into a negative going direct current voltage, responsive to the 550 Hz value. The negative voltage is then stored in circuit 33 and its value is used to increase the frequency of the variable frequency oscillator (VFO) to reduce the frequency error. The VFO output over conductor 23 is increased to reduce the frequency difference in circuit 22 to the correct value and the same output is applied over conductor 36 to product demodulator 25 to reduce its frequency difference to the input of the loop. A similar action occurs when the frequency error is in the opposite frequency direction, but then the direct current voltages and the storage voltage are both below the normal value instead of above it.

In FIG. 1 a squelch circuit 37 has been added. This circuit sends out a disable signal over conductors 38 and 40 to disable the audio amplifier 20 and the DC storage circuit 33 whenever there is no input signal.

Circuit 37 is believed to be desirable because, during the time no signal is received, the loop control would be held in the storage position, ready for a signal. The squelch circuit 37 also performs its normal function of attenuating the noise output of the receiver during all silent periods. For most applications it is preferable to incorporate a squelch circuit as described in U.S. Pat. No. 3,337,808 wherein the proper squelch operation is applied to SSB signals.

There may be times when there are very few low frequency components in the voice waves. When this happens, the stored voltage in the storage circuit 33 may vary considerably and cause unwanted variations in the variable frequency oscillator. The net result is a series of unrelated frequencies which would have many of the characteristics of noise. To prevent such an occurrence, a wave detector 42 is added to the circuit, having its input connected to the discriminator 31 and its output connected to the storage circuit 33. Storage circuits are well known in the communications art. One such circuit which may be adapted to the present invention is described in U.S. Pat. No. 3,275,940 as shown in that patent's FIG. 3. Circuit 42 detects the noise like wave occurrence by detecting relatively high frequency components, and when these occur, a voltage is sent to the storage circuit 33 preventing a drop in the stored voltage and maintaining a constant VFO output frequency.

FIG. 6 shows the noise-like wave detector 42 in detail. The input to the noise-like wave detector is fed through a highpass filter 43 with a cutoff frequency of approximately 100 to 500 Hz. The output of filter 43 is amplified in amplifier 44 and fed to a detector 45 which may be a diode detector and which produces a DC control voltage which is used to control DC storage device 33. Thus, during those instances when speech is present but the lowest frequency component is greater than 350 Hz, discriminator 31 no longer produces a constant DC voltage but produces a noise-like wave having higher frequency components. These higher frequency components would then be detected by the noise-like wave detector 42 and a control voltage would be produced to force the DC storage device to its storage condition. The cutoff of high pass filter 43 is not critical and different values may be used in order to optimize different systems. An amplifier 44 is fed by a gain adjustment device so as to optimize performance.

Variable frequency oscillators and their controls are well known in the art and are available from manufacturers. One such circuit is for sale by Intersil, Inc. of Cupertino, Calif. A description of a controlled VFO may be found in "Information Transmission, Modulation and Noise" by M. Schwartz, pages 136 to 140, McGraw-Hill, New York 1959.

It will be apparent that the above system can also be used for frequency measuring purposes as well as for automatic frequency control. For this application the frequency of HFO 17 and of variable frequency oscillator 34 should be measured. The difference of these two measurements will be equal to the frequency of the transmitter's suppressed carrier.

The system shown in FIG. 1 is a closed loop negative feedback frequency stabilization system and therefore the design requirements for stable operation must be met as described in J. B. Truxal, *Control System Synthesis*, 1966, New York, McGraw-Hill. The system may also be used in an open loop system but with some possible loss in control accuracy.

Figure 7:
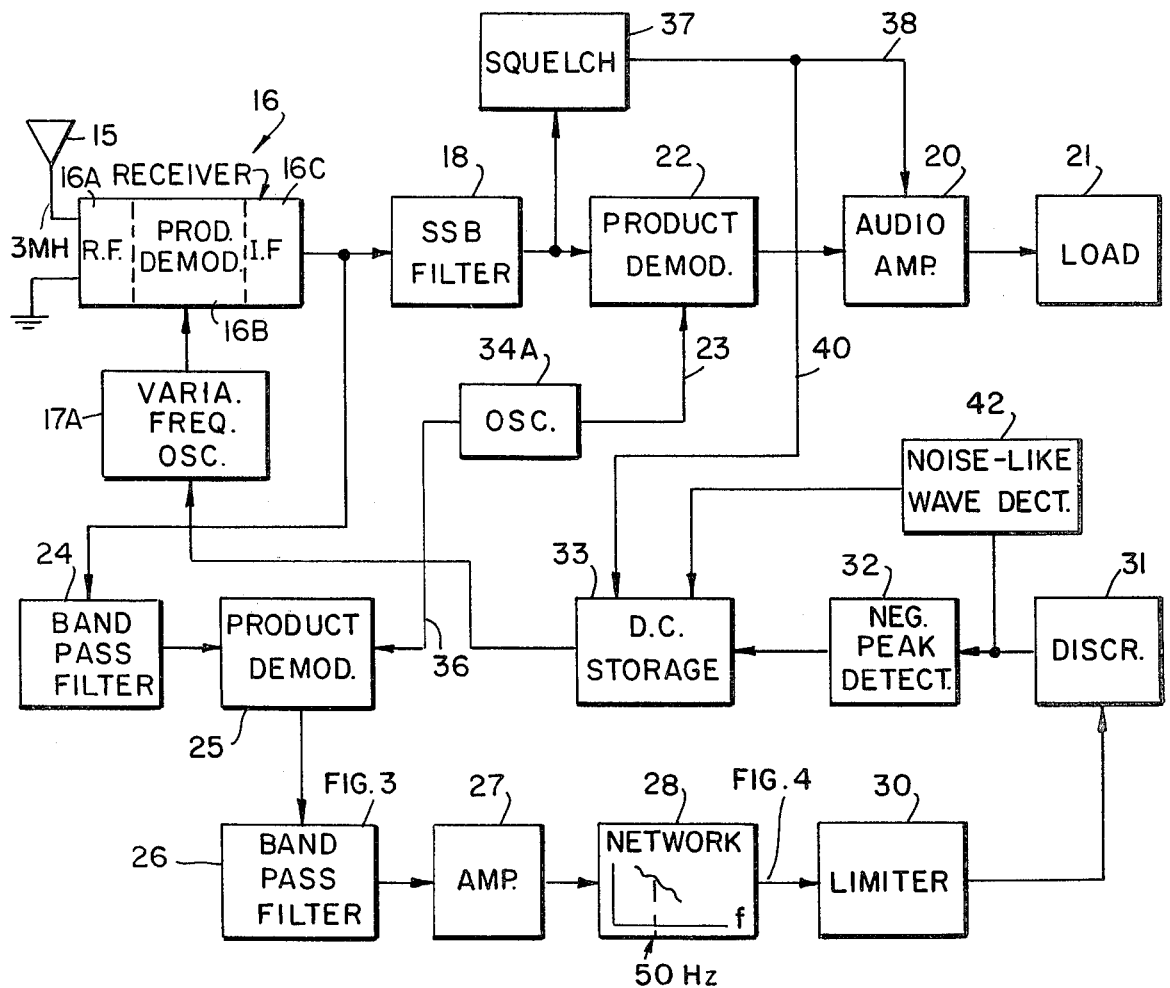
FIG. 7 is a schematic showing of an alternate type of circuit, similar to FIG. 1, but having the frequency correction current applied to the first oscillator in the radio receiver.

The circuit shown in FIG. 7 is similar to the circuit shown in FIG. 1, except that the variable frequency oscillator 34 is replaced by a fixed frequency oscillator 34A and the fixed frequency oscillator 17 is replaced by a variable frequency oscillator 17A. The receiver 16 is shown divided into a radio frequency amplifier 16A, a mixer circuit 16B, and an intermediate amplifier 16C, these components of a superheterodyne receiving system being well known in the art. The output of the D.C. storage circuit 33 is connected to oscillator 17A and controls its frequency in response to the control signal received from the peak detector 32, discriminator 31 and the other network components as described above. The circuit shown in FIG. 7 operates in the same manner as the circuit shown in FIG. 1 except that the frequency control is applied to the first frequency conversion circuit instead of the second.

It may be advantageous in some applications of the above described receiving systems to convert the output of product demodulator 25 from the frequency range of 50 to 650 Hz. to a higher frequency say 10,050 to 10,650 Hz. The higher frequency will allow the system to correct frequency more rapidly and some of the required components in blocks 26, 27, 28, 30, and 31 may be smaller and less expensive. One convenient method for providing this new frequency range is to decrease the frequency from the VFO 34 by 10 KHz by use of a mixer fed by both the VFO output and a 10 KHz fixed frequency oscillator. The translated frequency is then used to feed product demodulator 25 and the resulting output frequency components will all be increased by 10 KHz.

The above described circuit not only saves transmitter power in entirely eliminating the transmitted carrier in modulation systems, it also eliminates almost all traces of the transmitted wave when no audio signal is sent to the transmitter.

Having thus fully disclosed the invention, what is claimed and desired to be secured by Letters Patent is:

1. A communications system subject to frequency translation errors comprising;
   a transmitter which produces a modulated wave as a function of an input signal and a receiver which demodulates the received wave to produce an output wave corresponding to said input signal,
   said transmitter incorporating filter means which imparts an identifiable frequency response characteristic to the modulated wave,
   said receiver incorporating means for sensing frequency translation errors in the received identifiable frequency response characteristic, and,
   means for frequency translating received signal components incorporating an oscillator the frequency of which shifts responsive to the translation frequency errors sensing means by an amount and direction to reduce the frequency translation errors in the receiver's output wave.

2. An SSB communications system comprising a source of input signals, a transmitter for generating signals modulated by said input signals including means for substantially attenuating the carrier frequency, one of the two sideband waves, and all the components representing low frequency components of the input signal in the desired sideband below a specific frequency value,
   a receiver for receiving the signals generated by the transmitter including demodulation means and including sensing means for determining frequency translation errors in the frequency of the lowest frequency components received relative to said specific frequency waves value used in the transmitter and means controlled by said sensing means for correcting signal frequency translation errors.

3. A communications system comprising;
   a source of input signals, a transmitter for generating a modulated wave modulated by said input signals and including filtering means which allow the transmission of only a single-sideband wave, said wave sharply limited by said filtering means to contain only frequency components representing input signals within a frequency range either above a low frequency predetermined frequency limit or below a high frequency predetermined frequency limit, and receiving system comprising demodulation means and means for determining frequency translation errors in the received components representing at least one of the two predetermined frequency limits and means for translating the frequency of demodulated components in the receiver system so as to reduce frequency translation errors in the system the amount and direction of the translation controlled by said error determining means.

4. A system according to claim 3 wherein the filtering means causes the low frequency limit to lie within 100 to 500 Hz.

5. A single-sideband transmitting-receiving system including a single-sideband transmitter for transmitting modulated waves representing voice signals and a receiver circuit for receiving and demodulating said waves, wherein the improvement comprises: filtering means incorporated in the transmitter for transmitting only a single-sideband and for limiting the frequency of the sideband waves to a predetermined cut-off frequency value; sensing means incorporated in the receiver circuit for sensing the signal frequency in the sideband closest to the carrier frequency, said sensing means comprising a discriminator circuit for converting variations in frequency into amplitude voltage variations and a control circuit including a variable frequency oscillator responsive to said voltage variations for correcting frequency errors in the audio signal wave output of the receiver.

6. A system according to claim 5 wherein the discriminator is connected to a storage circuit for maintaining the discriminator voltage during periods when no signals are received at approximately the limit frequency.

7. A communications system comprising a transmitter which generates modulated waves derived from a modulating signal, said transmitter including electrical filter means for eliminating specific frequency signal components from the modulated wave; a receiver for receiving and demodulating said modulated waves generated by the transmitter and including sensing means for determining the frequency limit values of the received specific eliminated frequency components and frequency correction means responsive to said sensing means for reducing any frequency errors in the received demodulated waves.

8. A method for reducing frequency errors in a suppressed carrier communications system including a transmitter which generates a modulated wave derived from a modulating signal and a receiver for receiving and demodulating said modulated wave comprising the following steps:

1. at the transmitting end of the system filtering the signal modulating wave so as to limit the frequency of sideband components closest to the suppressed carrier frequency and at the receiver end of the system,
2. sensing the frequency of the received sideband components closest to the suppressed carrier frequency,
3. controlling the frequency of a variable frequency oscillator as a function of the sensed frequency of said received sideband components, and
4. coupling the output of the variable frequency oscillator to frequency conversion means in the received signal path so as to reduce frequency translation errors in the demodulated signal wave.

9. A suppressed carrier communications system, comprising;
a transmitter incorporating means for restricting the signal's frequency response characteristic to a predetermined cutoff frequency value so as to establish an accurate reference frequency;
a receiver incorporating means for determining frequency translation errors in the received reference frequency;
said error determining means incorporating means for deriving a fairly sharp spectrum component; and,
means for deriving from the sharp spectrum component a control voltage for controlling the frequency of an oscillator, said oscillator connected to heterodyning means, said heterodyning means also fed a signal wave so as to translate the frequency of the received signal's components in a direction and by an amount proper to tend to remove the frequency translation errors.

10. A system according to claim 9 wherein the suppressed carrier communications system is a single-sideband system.

11. A system according to claim 9 wherein the means for restricting the signal's frequency response characteristic is a highpass filter inserted in the audio frequency portion of the transmitter circuit.

12. A receiver for receiving modulated waves produced by transmitters which eliminate specific frequency signal components from the modulated waves they generate comprising means for demodulating the received modulated waves and including sensing means for determining the frequency limit values of the received specific eliminated frequency components and frequency correction means responsive to said sensing means for reducing any frequency errors in the received demodulated waves.

13. In a receiving system for receiving signals having a known sharp low frequency audio cutoff characteristic means for sampling components representing the lowest audio frequency signal components received,
means for determining the variance between the sampled component's frequency and the expected frequency cutoff characteristic of the transmitted signal; and,
means for controlling the frequency of the variable frequency oscillator portion of an automatic frequency stabilization circuit as a function of the variance determination so as to substantially reduce frequency translation errors in the receiver's output signal.

14. A single-sideband communication system for transmitting voice signals and including means for automatically compensating for frequency translation errors of the receiver's output signal comprising;
a transmitter including a highpass filter in series with a modulation signal input and having a cutoff frequency within the range of 100 to 500 Hertz for creating a reference frequency equal to the frequency representing the lowest transmitted voice frequency component;
means incorporated in the receiver including a first product demodulator and a sideband filter for receiving the transmitted wave, and a second product demodulator connected to a point ahead of the input of said sideband filter for delivering demodulated voice frequencies to the low frequency input of a frequency control circuit, a variable frequency oscillator coupled to both the first and second product demodulators for supplying an output frequency corrected to at least closely approximate the received signal's carrier frequency of the signal fed to the two product demodulators and circuitry for controlling the operating frequency of a variable frequency oscillator including network means for isolating the lowest voice frequencies in the transmitted wave appearing at the output of the second product demodulator a discriminator for converting the frequency values of the isolating waves into a direct current control voltage connected to the control circuit of said variable frequency oscillator.

15. A transmitting-receiver system as claimed in claim 14 wherein the network means for isolating the lowest voice frequencies in the transmitted wave includes a bandpass filter for eliminating frequencies outside said frequency range, a network which progressively attenuates received waves as the frequency increases, a limiter for eliminating amplitude modulation and which feed the discriminator, and a storage circuit connected to said oscillator for storing control voltages.

16. A transmitting-system as claimed in claim 15 wherein the network means for isolating the lowest voice frequencies in the transmitted wave includes a band pass filter for eliminating frequencies external to said frequency range, a network which progressively attenuates received waves as the frequency increases, a limiter for eliminating amplitude modulation, a discriminator, and a storage circuit connected to said oscillator for storing control voltages.

* * * * *